United States Patent [19]
Krümmel et al.

[11] Patent Number: 5,300,901
[45] Date of Patent: Apr. 5, 1994

[54] ARRANGEMENT FOR COUPLING IN OF MICROWAVE ENERGY

[75] Inventors: Harald Krümmel, Mainz; Ewald Mörsen, Ingelheim/Rhein; Helge Vogt, Nackenheim; Günter Weidmann, Armsheim, all of Fed. Rep. of Germany

[73] Assignee: Schott Glasewerke, Mainz, Fed. Rep. of Germany

[21] Appl. No.: 910,879

[22] Filed: Jul. 10, 1992

[51] Int. Cl.⁵ .............................................. H01P 7/04
[52] U.S. Cl. ............................ 333/99 PL; 333/230; 333/235; 333/222; 331/96
[58] Field of Search ............ 333/235, 202, 212, 219.1, 333/207, 208, 210, 222, 223, 224, 225, 226, 227, 228, 229, 230–234, 99 PL; 331/96, 107 DP, 117 D

[56] References Cited

U.S. PATENT DOCUMENTS

| | | | |
|---|---|---|---|
| 2,527,549 | 10/1950 | Herring, Jr. | 333/235 |
| 2,646,470 | 7/1953 | Doolittle | 333/235 |
| 2,751,499 | 6/1956 | Glass | 333/235 |
| 4,769,620 | 9/1988 | Nicotra | 331/96 |
| 4,794,354 | 12/1988 | Dinsmore et al. | 333/207 |
| 4,866,346 | 9/1989 | Gaudreau et al. | 315/111.21 |
| 4,971,651 | 11/1990 | Watanabe et al. | 156/643 |

FOREIGN PATENT DOCUMENTS 3905303 8/1989 Fed. Rep. of Germany .
4028525 3/1991 Fed. Rep. of Germany .

OTHER PUBLICATIONS

J. Physique–Letters 43, 1982, L 71–L 75.
Groll, Horst, Friedr. Vieweg & Sohn GmbH (1969).
Meinke et al., "Taschenbuch der Hochfrequenztechnik" [Manual of High-Frequency Technology], pp. 420–421, Springer-Verlag, 1968.

Primary Examiner—Raymond A. Nelli
Attorney, Agent, or Firm—Millen, White, Zelano, & Branigan

[57] ABSTRACT

An arrangement for coupling microwave energy with a reaction chamber, including electrically stable tuning and being, within limits, tolerant against changes in critical dimensions and power fluctuations. A coaxial line between a hollow waveguide and the reaction chamber is of such a structure that it forms, at least together with the reaction chamber, a loss resonator for the microwave frequency employed. The coaxial line can comprise an absorber or, alternatively, can be made of a poorly conductive material. There is also the possibility of downgrading the quality of the resonator by leaving an annular gap between a metal plate and an outer conductor section.

18 Claims, 3 Drawing Sheets

ARRANGEMENT FOR COUPLING IN OF MICROWAVE ENERGY

BACKGROUND OF THE INVENTION

The invention relates to an arrangement for coupling in of microwave energy into a reaction chamber.

In the coating of substrates, especially of calotte-shaped or cup-shaped substrates, the latter are exposed, in a reaction chamber, to the plasma of a reaction gas stimulated by means of microwaves. The quality of the coating depends, inter alia, on the constancy of the introduced microwave energy. If variations are encountered with respect to the radiated-in microwave energy, the coatings of the successively treated calottes exhibit differing qualities. The components responsible for coupling the microwave energy into the reaction chamber exert a substantial influence on the constancy of the introduced microwave energy.

DE 3,905,303 A1 describes an apparatus for the production of a plasma by means of microwaves wherein a discharge tube is arranged in the coaxial line, this tube passing over into a reaction chamber. The coaxial waveguide and the reaction chamber form, together with the discharge tube, a resonator for the microwave frequency utilized. Microwave loss is reduced by the provision of a metallic throttle or of a metallic attachment at the end plate mounted to the coaxial waveguide. A similar arrangement is disclosed in DE 4,028,525.

U.S. Pat. No. 4,886,346 describes an arrangement of microwave components capable of producing a rotationally symmetrical microwave field ($E_{01}$ microwave field) in order to generate thereby a rotationally symmetrical plasma in a glass recipient. For tuning the microwaves to be introduced, the coupling-in arrangement exhibits two tuning elements requiring, for an electrically stable operation, an exact tuning in the 1/10 mm range. Changes in length in this order of magnitude can easily arise if the temperature of the resonator is not accurately stabilized.

This is very expensive, with the relatively large dimensions of the coupling-in device. Furthermore, the frequency of the magnetron as the microwave source, preferably utilized for high power, changes with the temperature, the output, and the age. This likewise results in detuning so that the microwave energy radiated into the reaction chamber does not correspond to the desired values.

A so-called "Surfaguide" structure has been disclosed in J. Physique 43, 1982, L 71 consisting, in part, of the same components, in principle, as in U.S. Pat. No. 4,866,346; by means of this structure, a rotationally symmetrical microwave field is produced for the buildup of a plasma. This arrangement likewise requires two tuning elements which must be very accurately adjusted and must retain this setting within very narrow tolerances.

U.S. Pat. No. 4,971,651 discloses a process and apparatus for coupling in microwaves wherein absorbing or scattering components are introduced into the zone of the microwave radiation in such a way that electromagnetic fields which, without this measure, would locally raise the plasma density, are attenuated or eliminated by scattering. In this way, the distribution of the intensity of the electromagnetic field in the plasma and thus the result of the microwave treatment are to be made uniform. According to U.S. Pat. No. 4,971,651, the absorber or the scattering component must exhibit an exactly defined shape and must be arranged at exactly defined locations within the microwaveguide so that they can fulfill their objectives. Shape and locations must be determined in preliminary tests. If, for example, the configuration of the microwaveguide and the discharge vessel are changed, then location and shape of the absorber and/or of the scattering component must be newly determined for ensuring uniformity. However, U.S. Pat. No. 4,971,651 yields no hint as to how a microwave coupling into a plasma must be structured so that such coupling is extensively tolerant with respect to changes of geometrical dimensions and outputs of the coupling arrangement.

SUMMARY OF THE INVENTION

It is, therefore, an object of the invention to find a coupling arrangement for the transmission of microwave energy from a waveguide into a reaction chamber wherein the coupling arrangement is to exhibit an electrically stable tuning which, within limits, is tolerant against critical fluctuations in dimensions and power based on temperature variations.

The microwave components are customarily manufactured from a readily conductive metal if it is intended to produce a resonator of high quality. Contrary to the general desire of further improving the resonators with regard to their quality, it is advantageous, with respect to the sensitivity to faulty adaptation on account of changes in geometry, to use a resonator exhibiting a markedly poorer quality than the usually employed resonators. The quality of the coupling-in device, however, must not be impaired to such a degree that excitation of the plasma in the reaction chamber can no longer take place. When tuning the power coupled in under consideration of these points, then a temperature stabilization as otherwise needed in the state of the art can be extensively eliminated. In some applications, it is sufficient merely to conduct a rough temperature stabilization.

The arrangement, according to one embodiment, can be desensitized by producing at least portions of the coaxial line from a poorly conductive material, for example a poorly conductive metal. This feature can concern portions of the outer conductor and/or of the inner conductor of the coaxial line.

Instead of using poorly conductive metals, such as steel, for example, the components can also consist, for example, of graphite, or they can be graphite-coated.

In the coating of calotte-shaped substrates, the calotte-shaped substrate constitutes the vacuum vessel together with a further vessel part, especially a metal plate, and thus forms the reaction chamber. In reaction chambers of such a structure, the metal plate can consist of a poorly conductive material.

According to another embodiment, the quality of the resonator can be reduced by introducing an absorber into the coupling arrangement. In contrast to the state of the art as known from U.S. Pat. No. 4,971,651, the position and the arrangement of the absorber in the region of the coupling arrangement are extensively uncritical. It is thus possible to fashion already existing components in the coaxial line as the absorber. In case of a coaxial line, the inner conductor with which the E field coupling is performed, for example, must be affixed to the outer conductor by means of a supporting ring. This supporting ring can be designed as an absorber in accordance with a special embodiment by making this ring of a dielectric material. The supporting ring can consist, for example, of glass ceramic which offers the advantage that it will be almost entirely devoid of expansion in spite of a strong heating up on account of absorption of microwave energy, and therefore will not be damaged, or damage other components due to expansion.

There is also the possibility of making the supporting ring of a nonabsorbent material and to have water flowing therethrough. In this case, it is possible to build up the supporting ring of two parts and to introduce into one of the two parts an annular milling for the through-flow of the water. The supporting ring can also be made in the form of a water-traversed circular tube of a synthetic resin or of glass. The use of water in the region of the supporting ring designed as an absorber is of advantage in case microwaves are used in a range of 2.45 GHz. Other suitable liquid absorbers are known for other microwave frequencies.

The spacing of the supporting ring from the reaction chamber should be at least $\frac{1}{2}$ of the microwave frequency employed so that any modes that are not rotationally symmetrical, excited by the supporting ring, will be attenuated sufficiently extensively in the region between the absorber and the reaction chamber.

A further possibility of absorbing microwaves resides in having the outer conductor terminate without electrical contact in a spacing of several millimeters above a conductive component of the reaction chamber. The radiation of power lost through this gap, formed in this way, likewise acts as a loss source. A back reflection into the zone of the outer conductor can be prevented by commercially available microwave absorbers in the outer chamber.

If the diameter of the reaction chamber is determined by the diameter of the calotte-shaped substrate, this minimum diameter of the transition zone is to be chosen smaller than the diameter of the calotte-shaped substrate. The largest diameter of the outer conductor of the transition section is larger than/equal to the diameter of the reaction chamber or, in case of the coating of calotte-shaped substrates, larger than/equal to the diameter of the calotte-shaped substrate.

The outer conductor—inner conductor diameter ratio is constant so that the wave impedance will not change. Depending on the configuration of the inner conductor, E field or H field coupling is achieved.

The narrowest point of the transition section of the coaxial line serves as the wave-type filter so that only the rotationally symmetrical TEM wave type is capable of propagation.

The continuously flaring transition zone serves for widening the coaxial waveguide without surges to a diameter corresponding to that of the reaction chamber. In this connection, however, the diameter must be chosen to be so small that only the TEM mode for the microwave energy utilized is capable of propagating in the subsequent second section.

If the reaction chamber is defined by calottes or cup-shaped substrates having a maximum diameter of 50 mm, then the 2.45 GHz microwave is suitable for the coating step, for example. Therefore, depending on the size of the calottes cup-shaped substrates to be coated, other microwave frequencies can also be necessary.

The second section following the transition section and extending into the region of the reaction chamber consists of a coaxial waveguide having a constant diameter $D_2$. The diameter is chosen so that only the TEM coaxial mode can be propagated.

The plasma ignited in the calotte is a continuation of the inner conductor and thus permits further propagation of the TEM wave.

The length of the second section of the coaxial line is selected so that, in conjunction with the tuning element, an optimum power adaptation to the system of coaxial line/reaction chamber is provided.

It is also possible to utilize a conventional coaxial cable between the transition zone and the waveguide which then fulfills the task as a wave-type filter.

BRIEF DESCRIPTION OF THE DRAWINGS

Exemplary embodiments will be described in greater detail below with reference to the drawings wherein.

DETAILED DESCRIPTION

Figure 1:
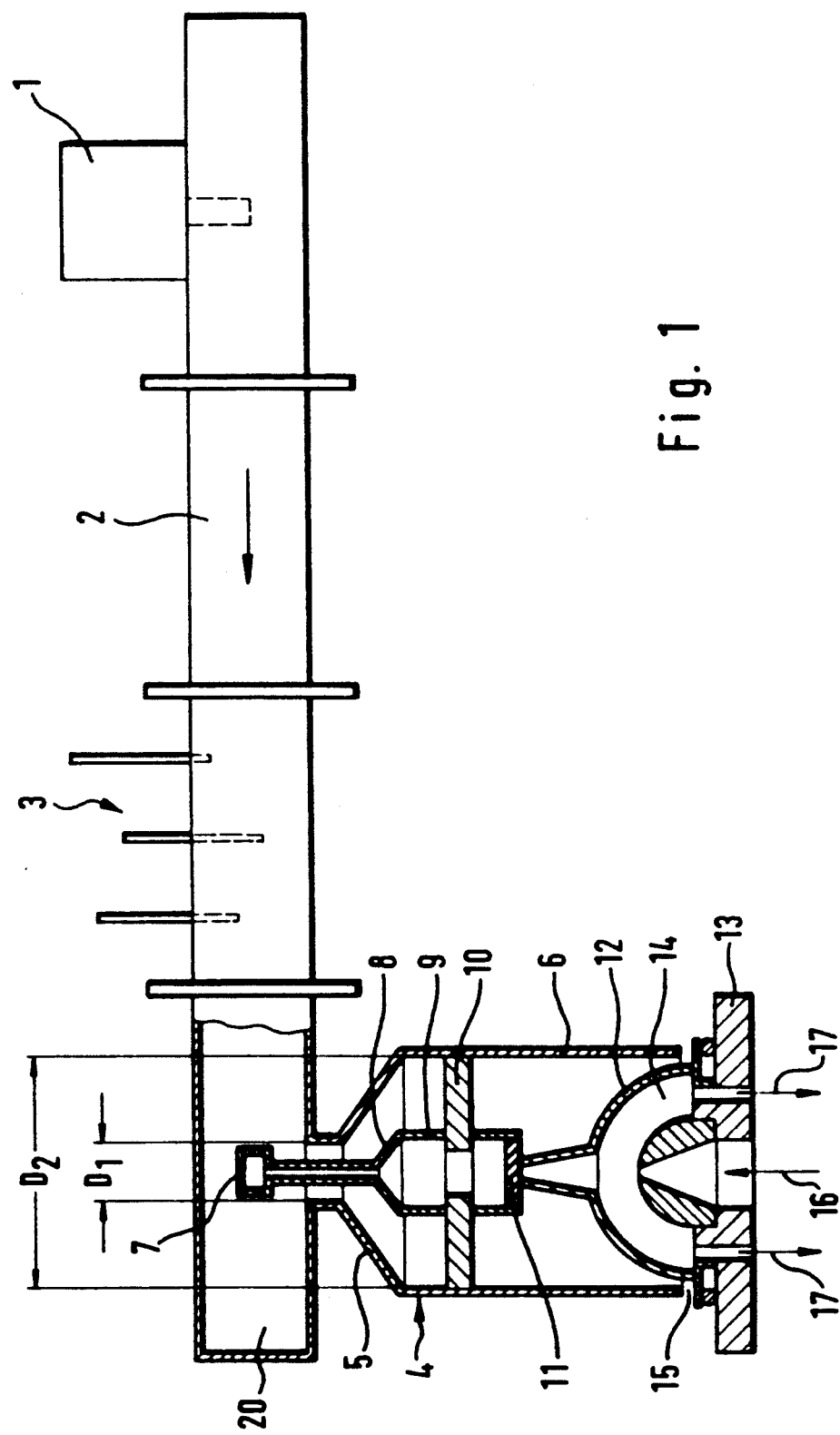
FIG. 1 shows a schematic view of a coupling-in arrangement.

FIG. 1 is a schematic view of a microwave device with a coupling-in arrangement. A magnetron is connected to a waveguide 2 designed as a one-way line. A three-winding transformer 3 or subturner as the tuning element is arranged in the waveguide 2 in front of the coupling-in site. The coupling-in arrangement comprises a coaxial waveguide 4 with an inner conductor 7, 8, 9 and an outer conductor which form a transition section 5, 6. The inner conductor 7 extends into the waveguide for E field coupling and continues in the downward direction in a transition section 5, 8 and an end section 6, 9. The inner conductor flares continuously in the transition section 8 until it has reached the diameter of the end section 9. The transition section zone 5 forming the outer conductor is also designed correspondingly, the ratio of the diameters of the transition sections 5, 8 being constant. The smallest diameter $D_1$ of the transition section 5 forming the outer conductor is smaller than the diameter of the calotte 12 to be coated. The largest diameter $D_2$ of the transition zone 5 of the outer conductor is larger than/equal to the diameter of the calotte 12.

The second section 6 includes a chemical vapor deposition (CVD) chamber 19 and has a constant outer diameter $D_2$.

The inner conductor end section 9 is retained at the second section 6 forming the outer conductor section by a supporting ring 10. This supporting ring 10 is designed as an absorber and reduces the quality of the resonator, formed in FIG. 1 by the section 20 of the microwaveguide 2, the coaxial waveguide 4 and the reaction chamber 14. The end of the end section 9 of the inner conductor is provided with a sealing element 11 seated on the neck of the calotte 12 and closing off this neck. The calotte 12, together with the metal plate 13, forms the vacuum chamber 14 wherein the coating reaction by chemical vapor deposition (CVD) takes place. For this purpose, the plate 13 is equipped with a gas inlet 16 and peripheral gas outlets 17.

The components 5, 6, 8, 9 can also be made of a poorly conductive material or they can be coated, for example, with graphite.

The supporting ring 10, fashioned as an annular plate in the illustration shown here and being installed perpendicularly to the axis of the coaxial waveguide 4, can also be traversed by water. The position of the supporting ring 10 is uncritical, and the ring can be disposed farther toward the top as well as farther toward the bottom as compared with the embodiment shown herein, but in this connection, a minimum spacing of λ/2 of the microwave frequency utilized should be maintained between the absorber 10 and the reaction chamber 14.

A further possibility for downgrading the quality of the resonator is likewise indicated in FIG. 1 by the feature that the outer conductor 6 is not in contact with the metal plate 13 but rather terminates above this plate. Thereby, an annular gap 15 is produced through which the microwave energy can be dissipated by radiation. An absorber, not shown, in the outer chamber prevents the radiated-off microwave energy from passing into the outer region.

Figure 2:
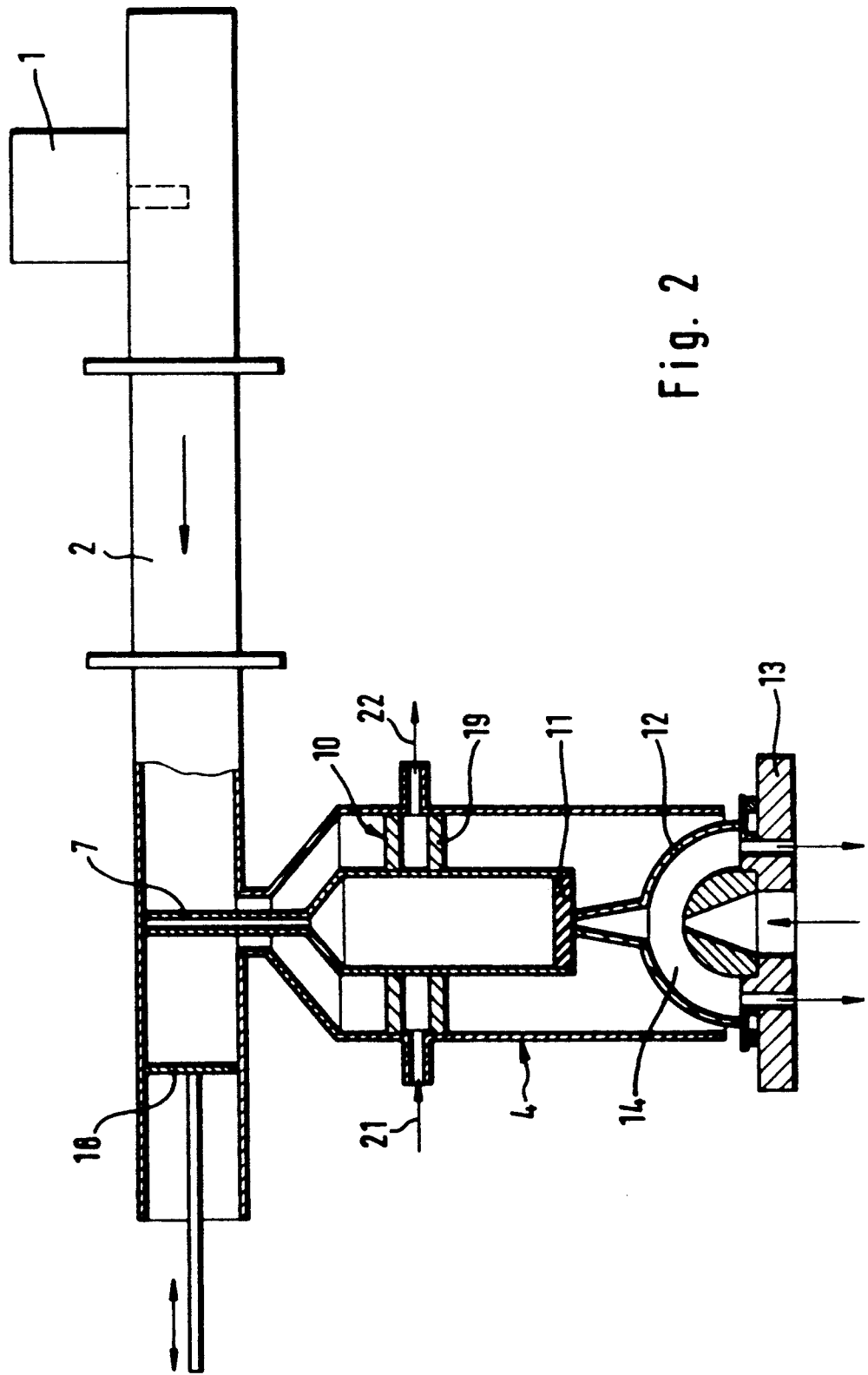
FIG. 2 is a schematic representation of a coupling-in arrangement according to another embodiment.

FIG. 2 differs from FIG. 1 in that a short-circuit plunger 18 is arranged instead of a three-winding transformer subturner as the tuning element in the hollow microwave guide 2, and that the inner conductor 7 is connected to the wall of the waveguide 2 for H field coupling. Furthermore, the absorber 10 is designed to be bipartite as an annular tube 19 and comprises an intake 21 and a drain 22 so that the absorber can be traversed, for example, by water.

Figure 3:
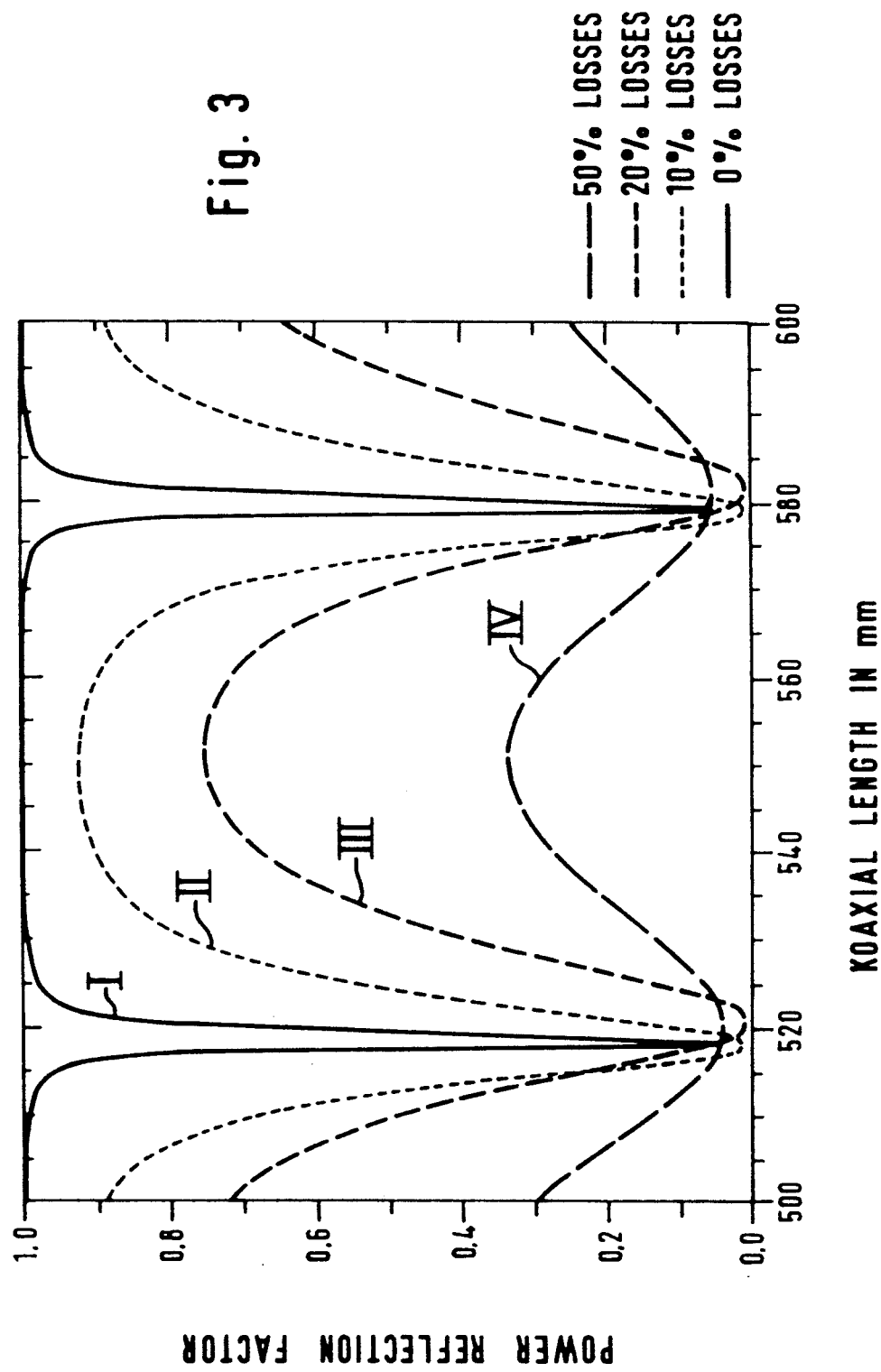
FIG. 3 shows the power reflection factor in dependence on the length of the coaxial waveguide for various loss factors.

FIG. 3 illustrates the reflection factor of the power in dependence on the length of the coaxial line 4. When using a coaxial waveguide length of about 518 mm, the resonator exhibits a behavior according to curve I at a frequency of 2.45 GHz with optimum tuning. The reflected power is then equal to zero in the range of 518 mm, i.e. the entire power is available for ignition and maintenance of the plasma.

If, in this ideal resonator, the coaxial waveguide length is changed by temperature fluctuations, then the reflection rises jump-like as early as one-tenth of a millimeter. A change in the coaxial waveguide length by 1 mm means an increase in the reflection factor by 50%. If the quality of the resonator is downgraded, for example by the installation of an absorber, the reflection factor changes to a markedly lesser extent. When installing an absorber having a loss of merely 10% (see curve II), then the entire arrangement is already 6 times less sensitive with respect to an identical change in length. Therefore, by the choice of the absorber, the sensitivity can be controlled, the sensitivity of the resonator with respect to changes in length becoming increasingly lower with increasing losses. Thus, an additional temperature stabilization can be dispensed with whereby the entire arrangement becomes more economical.

What is claimed is:

1. An arrangement for coupling microwave energy into a reaction chamber (14) with a waveguide (2) comprising:
   (a) a plasma CVD coating device (16) within the reaction chamber (19);
   (b) a coaxial waveguide (4) located between the waveguide (2) and the reaction chamber (14) wherein
   (c) the coaxial waveguide (4) and the reaction chamber (14) combine to form a resonator for a predetermined microwave frequency to be employed;
   (d) the resonator being configured with predetermined losses;
   (e) the coaxial waveguide (4) including at least first and second sections (5,8) and (6,9), respectively;
   (f) the first section (5,8) being connected to the waveguide (2) and having a diameter defined by an inner conductor (8) formed by the first section (5,8) of the coaxial waveguide and an outer conductor (5) formed by the first section (5,8) of the coaxial waveguide wherein the diameter increases continuously towards the reaction chamber (14); and
   (g) wherein said second section (6,9) has a coaxial waveguide section with a constant diameter ($D_2$).

2. The arrangement according to claim 1, wherein at least portions of the coaxial waveguide (4) are comprised of a poorly conductive material.

3. The arrangement according to claim 1, wherein at least one component (13) forming the reaction chamber (14) is made of a poorly conductive material.

4. The arrangement according to claim 1, wherein a vessel section (13), forming the reaction chamber (14) together with a calotte-shaped substrate (12) to be coated, is made of a poorly conductive material.

5. The arrangement according to claim 1, wherein the coaxial waveguide includes graphite.

6. The arrangement according to claim 1, wherein a microwave absorber (10) is positioned in the coaxial line (4).

7. The arrangement according to claim 6, wherein the microwave absorber (10) is a supporting ring holding the inner conductor (9) of the coaxial line (4).

8. The arrangement according to claim 7, wherein the supporting ring is made of glass ceramic.

9. The arrangement according to claim 7, wherein the supporting ring is fashioned as a liquid-traversed tube (19).

10. The arrangement according to claim 9, wherein the tube is made of glass or a synthetic resin.

11. The arrangement according to claim 7, wherein the spacing of the supporting ring from the reaction chamber (14) is about at least one-half wavelength of the microwave frequency employed.

12. The arrangement according to claim 11, wherein the spacing amounts to one wavelength of the microwave frequency employed.

13. The arrangement according to claim 1, wherein the outer conductor (6) of the coaxial waveguide (4) is located at a spacing with respect to a conductive component (13) of the reaction chamber (14).

14. The arrangement according to claim 1, wherein portions of the microwaveguide (2) are part of the resonator and wherein the microwaveguide (2), serving as the tuning element, has a three-winding transformer (3).

15. The arrangement according to claim 1, wherein the coaxial line (4) forms the resonator with reaction chamber (14), and the microwaveguide has, as the tuning element, merely a short-circuit plunger (18).

16. The arrangement according to claim 1, wherein the outer conductor to inner conductor diameter ratio of the first section (5, 8) of the coaxial line (4) is constant.

17. The arrangement according to claim 1, wherein a coaxial cable is disposed between the microwaveguide (2) and the first section (5, 8) of the coaxial waveguide (4), the coaxial cable being part of the resonator.

18. The arrangement of claim 1, wherein the first section (8) has a smallest diameter ($D_1$) which is smaller than a diameter of the section chamber (14) and having a largest diameter ($D_2$) which is equal to or greater than the diameter of the reaction chamber (14).

* * * * *